United States Patent
Nakayama et al.

(10) Patent No.: US 12,310,142 B2
(45) Date of Patent: May 20, 2025

(54) PHOTOELECTRIC CONVERSION ELEMENT AND SOLAR CELL

(71) Applicant: KABUSHIKI KAISHA TOSHIBA, Tokyo (JP)

(72) Inventors: Kohei Nakayama, Kawasaki Kanagawa (JP); Fumihiko Aiga, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 18/451,261

(22) Filed: Aug. 17, 2023

(65) Prior Publication Data

US 2024/0234600 A1    Jul. 11, 2024

(30) Foreign Application Priority Data

Jan. 6, 2023 (JP) ................... 2023-001050

(51) Int. Cl.
H10F 77/123 (2025.01)
H10F 19/90 (2025.01)

(52) U.S. Cl.
CPC ......... *H10F 77/123* (2025.01); *H10F 19/902* (2025.01)

(58) Field of Classification Search
CPC .............................. H10F 19/902; H10F 77/123
See application file for complete search history.

(56) References Cited

U.S. PATENT DOCUMENTS

| | | | |
|---|---|---|---|
| 2011/0162711 A1 | 7/2011 | Takeuchi et al. | |
| 2011/0214708 A1* | 9/2011 | Yago | H01L 31/0465 136/244 |
| 2012/0247536 A1 | 10/2012 | Kawai et al. | |
| 2018/0047862 A1* | 2/2018 | Martorell Pena | H10F 77/1692 |

FOREIGN PATENT DOCUMENTS

| | | |
|---|---|---|
| CN | 101787272 A | 7/2010 |
| JP | 2010-219551 A | 9/2010 |
| JP | 2011-116594 A | 6/2011 |
| JP | 2016-44232 A | 4/2016 |

OTHER PUBLICATIONS

Amjad Farooq et al., "Spectral Dependence of Degradation under Ultraviolet Light in Perovskite Solar Cells," ACS Appl. Mate. & Interfaces, vol. 10, pp. 21985-21990 (2018).

J. Tatebayashi et al., "Formation and optical characteristics of ZnO:Eu/ZnO nanowires grown by sputtering assisted metalorganic chemical vapor deposition," Jpn. J. Appl. Phys., vol. 60, pp. SCCE05-01 to SCCE05-5 (2021).

* cited by examiner

*Primary Examiner* — Golam Mowla
(74) *Attorney, Agent, or Firm* — Finnegan, Henderson, Farabow, Garrett & Dunner, LLP

(57) ABSTRACT

According to one embodiment, a photoelectric conversion element includes a photoelectric conversion layer, and a first member. The first member includes a first layer and a second layer. A direction from the second layer to the first layer is along a first direction from the photoelectric conversion layer to the first member. The first layer includes a plurality of particles and an intermediate region provided in at least a part of location between the plurality of particles. The plurality of particles include at least one selected from the group consisting of oxygen and sulfur and zinc. The intermediate region includes a rare earth element. The second layer includes a metal fluoride.

18 Claims, 3 Drawing Sheets

PHOTOELECTRIC CONVERSION ELEMENT AND SOLAR CELL

CROSS-REFERENCE TO RELATED APPLICATIONS

This application is based upon and claims the benefit of priority from Japanese Patent Application No. 2023-001050, filed on Jan. 6, 2023; the entire contents of which are incorporated herein by reference.

FIELD

Embodiments of the invention generally relate to a photoelectric conversion element and a solar cell.

BACKGROUND

For example, in photoelectric conversion elements, stable characteristics are desired.

DETAILED DESCRIPTION

Figure 1:
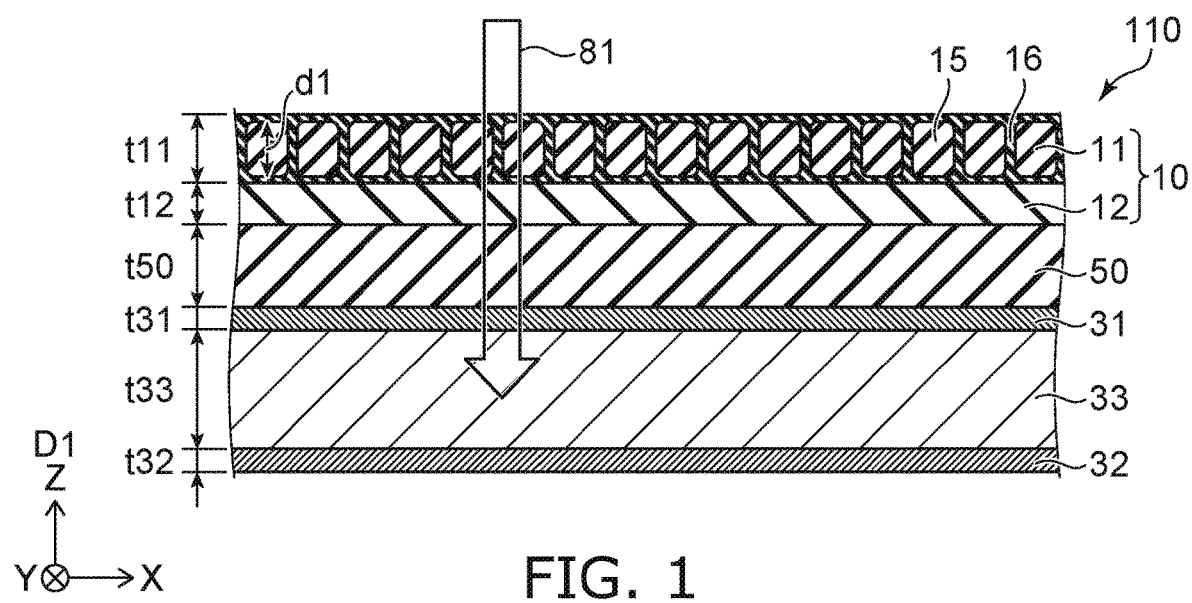
FIG. 1 is a schematic cross-sectional view illustrating a photoelectric conversion element according to a first embodiment.

According to one embodiment, a photoelectric conversion element includes a photoelectric conversion layer, and a first member. The first member includes a first layer and a second layer. A direction from the second layer to the first layer is along a first direction from the photoelectric conversion layer to the first member. The first layer includes a plurality of particles and an intermediate region provided in at least a part of location between the plurality of particles. The plurality of particles include at least one selected from the group consisting of oxygen and sulfur and zinc. The intermediate region includes a rare earth element. The second layer includes a metal fluoride.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a photoelectric conversion element according to a first embodiment.

As shown in FIG. 1, a photoelectric conversion element 110 according to the embodiment includes the photoelectric conversion layer 33 and the first member 10.

A first direction D1 from the photoelectric conversion layer 33 to the first member 10 is defined as a Z-axis direction. One direction perpendicular to the Z-axis direction is defined as an X-axis direction. A direction perpendicular to the Z-axis direction and the X-axis direction is defined as a Y-axis direction.

The photoelectric conversion layer 33 is, for example, layered along the X-Y plane. The first member 10 is, for example, layered along the X-Y plane.

The first member 10 includes a first layer 11 and a second layer 12. A direction from the second layer 12 to the first layer 11 is along the first direction D1. The first layer 11 is, for example, layered along the X-Y plane. The second layer 12 is, for example, layered along the X-Y plane. In this example, the second layer 12 is provided between the photoelectric conversion layer 33 and the first layer 11.

In this example, the photoelectric conversion element 110 further includes a first electrode 31 and a second electrode 32. The first electrode 31 is provided between the second electrode 32 and the first member 10. The photoelectric conversion layer 33 is provided between the second electrode 32 and the first electrode 31. The first member 10 is, for example, an inorganic member. Stable characteristics are easily maintained.

For example, the light transmittance of the first electrode 31 is higher than the light transmittance of the second electrode 32. For example, the light reflectance of the second electrode 32 is higher than the light reflectance of the first electrode 31. The first electrode 31 is, for example, a light transmissive conductive film. The second electrode 32 is a light-reflective conductive film. The first electrode 31 includes, for example, indium, tin, and oxygen. The second electrode 32 includes at least one selected from the group consisting of Al, Ag and Ti.

In this example, photoelectric conversion element 110 includes a base 50 being light transmissive. The base 50 is provided between the first electrode 31 and the first member 10. In one example, base 50 may include a resin. Light weight and large area can be easily obtained. The base 50 may include an inorganic material (e.g., glass, etc.).

As shown in FIG. 1, light 81 enters the photoelectric conversion layer 33 through the first member 10. In a case where photoelectric conversion element 110 is used in a solar cell, light 81 is sunlight. In this example, the light 81 passes through the first member 10, the base 50 and the first electrode 31 and enters the photoelectric conversion layer 33. In the photoelectric conversion layer 33, carriers are generated by the incident light 81. The generated carriers can be extracted via the first electrode 31 and the second electrode 32.

For example, the light converted in the photoelectric conversion layer 33 is, for example, visible light (for example, a wavelength of not less than 460 nm and not more than 680 nm). The photoelectric conversion is performed with high efficiency in visible light. For example, the light 81 may include ultraviolet rays (for example, wavelengths of 430 nm or less) in addition to visible light.

In a case where the light 81 include ultraviolet rays, if the ultraviolet rays are incident on the photoelectric conversion layer 33, the photoelectric conversion layer 33 is likely to deteriorate. The conversion efficiency in the photoelectric conversion layer 33 decreases. It is difficult to obtain stable characteristics. Furthermore, when ultraviolet rays are incident on the base 50, the base 50 may deteriorate. The degradation of the base 50 may reduce the visible light transmittance of the base 50. The incidence efficiency of the light 81 to the photoelectric conversion layer 33 is lowered, and as a result, the conversion efficiency in the photoelectric conversion layer 33 is lowered.

In the embodiments, in first member 10, the first layer 11 includes a plurality of particles 15 and an intermediate region 16. The intermediate region 16 is provided in at least a part of location between the plurality of particles 15. For example, the intermediate region 16 contacts at least a part of the particles 15.

The plurality of particles 15 include zinc and at least one selected from the group consisting of oxygen and sulfur. For example, the plurality of particles 15 includes at least one selected from the group consisting of zinc oxide (ZnO) and zinc sulfide (ZnS).

The intermediate region 16 includes a rare earth element. For example, the intermediate region 16 includes an oxide of a rare earth element. For example, the intermediate region 16 includes oxygen and at least one selected from the group consisting of europium, samarium and terbium. For example, the intermediate region 16 may include europium oxide. For example, the rare earth element included in the intermediate region 16 may adhere to the plurality of particles 15. For example, the intermediate region 16 may include at least one salt selected from the group consisting of carbonate, nitrate, and sulfate. For example, the intermediate region 16 includes the rare earth element, particles 15, and at least one salt selected from the group consisting of carbonate, nitrate, and sulfate. For example, the intermediate region 16 includes at least one salt selected from the group consisting of zinc carbonate, zinc nitrate, and zinc sulfate. For example, the intermediate region 16 includes at least one salt selected from the group consisting of an alkaline earth carbonate, an alkaline earth nitrate, and an alkaline earth sulfate. The alkaline earth includes at least one selected from the group consisting of calcium, magnesium, strontium and barium. For example, the intermediate region 16 includes a mixed crystal including at least two salts selected from the group consisting of carbonate, nitrate, and sulfate. For example, the intermediate region 16 includes a silicon polymer.

The plurality of particles 15 are, for example, wide bandgap semiconductors. Wide bandgap semiconductors have a bandgap larger than that of silicon (approximately 2.1 eV). In a wide bandgap semiconductor, for example, the bandgap is not less than 2.2 eV and not more than 3.8 eV.

For example, the plurality of particles 15 absorb ultraviolet rays. For example, the wavelength of ultraviolet rays absorbed is about 320 nm or less. For example, by energy of the absorbed ultraviolet, light, for example visible light is generated. For example, by the energy of the absorbed ultraviolet light, the rare earth element in the intermediate region 16 is activated and visible light is generated from the intermediate region 16 with high efficiency.

In the embodiment, by ultraviolet rays being absorbed in the first member 10, the deterioration of the photoelectric conversion layer 33 due to ultraviolet rays is suppressed, for example. For example, the deterioration of the base 50 due to ultraviolet rays is suppressed. According to the embodiments, it is possible to provide a photoelectric conversion element capable of obtaining stable characteristics.

Furthermore, in the first layer 11, ultraviolet light is converted into visible light with high efficiency. High conversion efficiency is obtained by the converted visible light entering the photoelectric conversion layer 33. Thereby, high conversion efficiency can be obtained while obtaining stable characteristics.

In the embodiment, the second layer 12 includes, for example, an inorganic material. Stable characteristics can be easily obtained. The second layer 12 includes, for example, a metal fluoride. The second layer 12 includes, for example, at least one selected from the group consisting of magnesium fluoride, lithium fluoride and calcium fluoride. For example, the refractive index of the second layer 12 is lower than the refractive that of the first layer 11.

As described above, in a case where the first layer 11 includes the above materials, the refractive index of the first layer 11 is relatively high. The refractive index of the first layer 11 is, for example, not less than 1.8 and not more than 2.6. The refractive index of the second layer 12 is, for example, not less than 1.2 and not more than 1.5. In a case where the second layer 12 is provided between the photoelectric conversion layer 33 and the first layer 11, light from the first layer 11 can efficiently travel toward the photoelectric conversion layer 33 (and the base 50). Higher efficiency is easily obtained.

In the embodiment, an average diameter d1 (see FIG. 1) of the plurality of particles 15 is, for example, not less than 40 nm and not more than 100 nm. For example, ultraviolet rays are absorbed efficiently. Visible light is efficiently transmitted.

A thickness of the first layer 11 along the first direction D1 is defined as a first thickness t11. The first thickness t11 is, for example, not less than 20 nm and not more than 200 nm. By the first thickness t11 being thinner than the wavelength of visible light, visible light can efficiently pass through the first layer 11. Ultraviolet rays can be efficiently absorbed by the first layer 11.

A thickness along the first direction D1 of the second layer 12 is defined as a second thickness t12. The second thickness t12 is, for example, not less than 500 nm and not more than 1000 nm. Visible light can efficiently pass through the second layer 12.

As shown in FIG. 1, the photoelectric conversion layer 33 has a thickness t33. The thickness t33 is, for example, not less than 50 nm and not more than 1000 nm. The first electrode 31 has a thickness t31. The thickness t31 is, for example, not less than 100 nm and not more than 400 nm. The second electrode 32 has a thickness t32. The thickness t32 is, for example, not less than 10 nm and not more than 200 nm. The base 50 has a thickness t50. The thickness t50 is, for example, not less than 10 μm and not more than 100 μm.

In the embodiment, at least a part of the photoelectric conversion layer 33 may have a perovskite structure. For example, the photoelectric conversion layer 33 includes a perovskite crystal material (e.g., lead methylammonium iodide: MAPbI3, etc.). High conversion efficiency is obtained. When ultraviolet rays are incident on the perovskite crystal material, the perovskite crystal material is likely to deteriorate. In the embodiment, the first member 10 effectively absorbs ultraviolet light. Thereby, deterioration is suppressed even when at least a part of the photoelectric conversion layer 33 has a perovskite structure. Stable characteristics can be obtained.

In the embodiment, a plurality of first layers 11 may be provided. Thereby, ultraviolet rays are absorbed more effectively.

Figure 2:
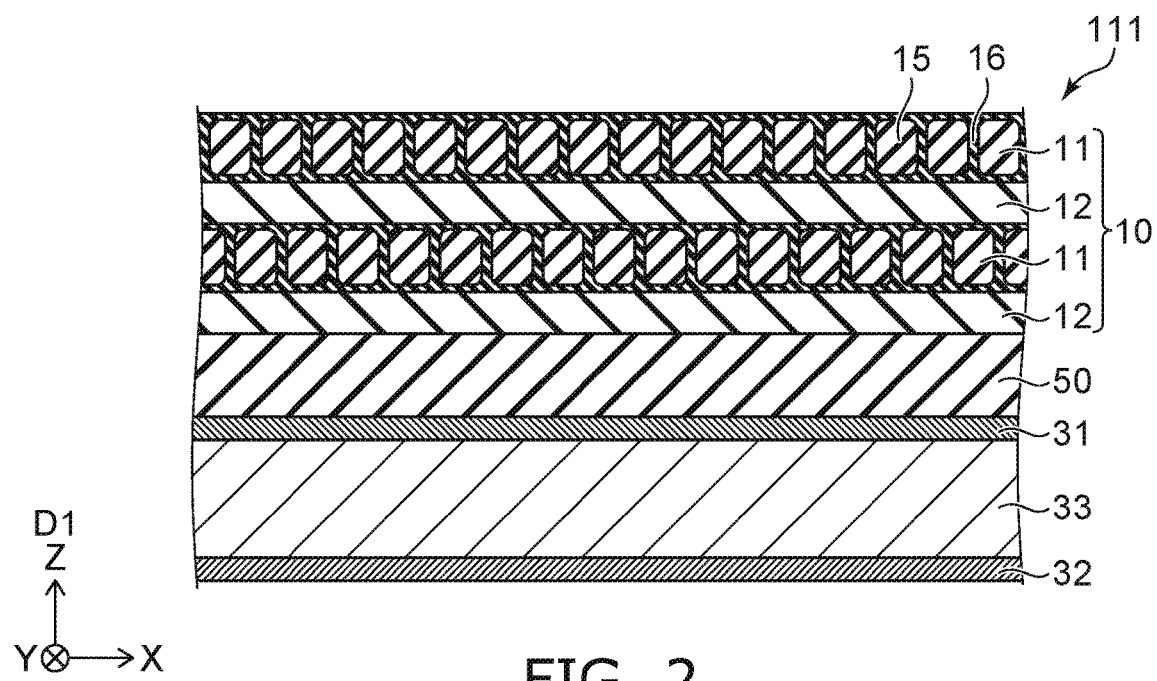
FIG. 2 is a schematic cross-sectional view illustrating a photoelectric conversion element according to the first embodiment.

FIG. 2 is a schematic cross-sectional view illustrating a photoelectric conversion element according to the first embodiment.

As shown in FIG. 2, in a photoelectric conversion element 111 according to the embodiment, a plurality of first layers 11 are provided in the first member 10.

For example, the first member 10 includes the plurality of first layers 11. The second layer 12 is provided between one of the plurality of first layers 11 and another one of the plurality of first layers 11. For example, the first member 10 may include the plurality of first layers 11 and a plurality of second layers 12. One of the plurality of first layers 11 is provided between one of the plurality of second layers 12 and another one of the plurality of second layers 12. One of the plurality of second layers 12 is provided between one of the plurality of first layers 11 and another one of the plurality of first layers 11.

Ultraviolet rays are effectively absorbed in each of the plurality of first layers 11. For example, the thickness of each of the plurality of first layers 11 (first thickness t11, see FIG. 1) is, for example, not less than 40 nm and not more than 100 nm. Each thickness of the plurality of first layers 11 is equal to or less than the wavelength of visible light. Thereby, attenuation of visible light is suppressed.

Figure 3:
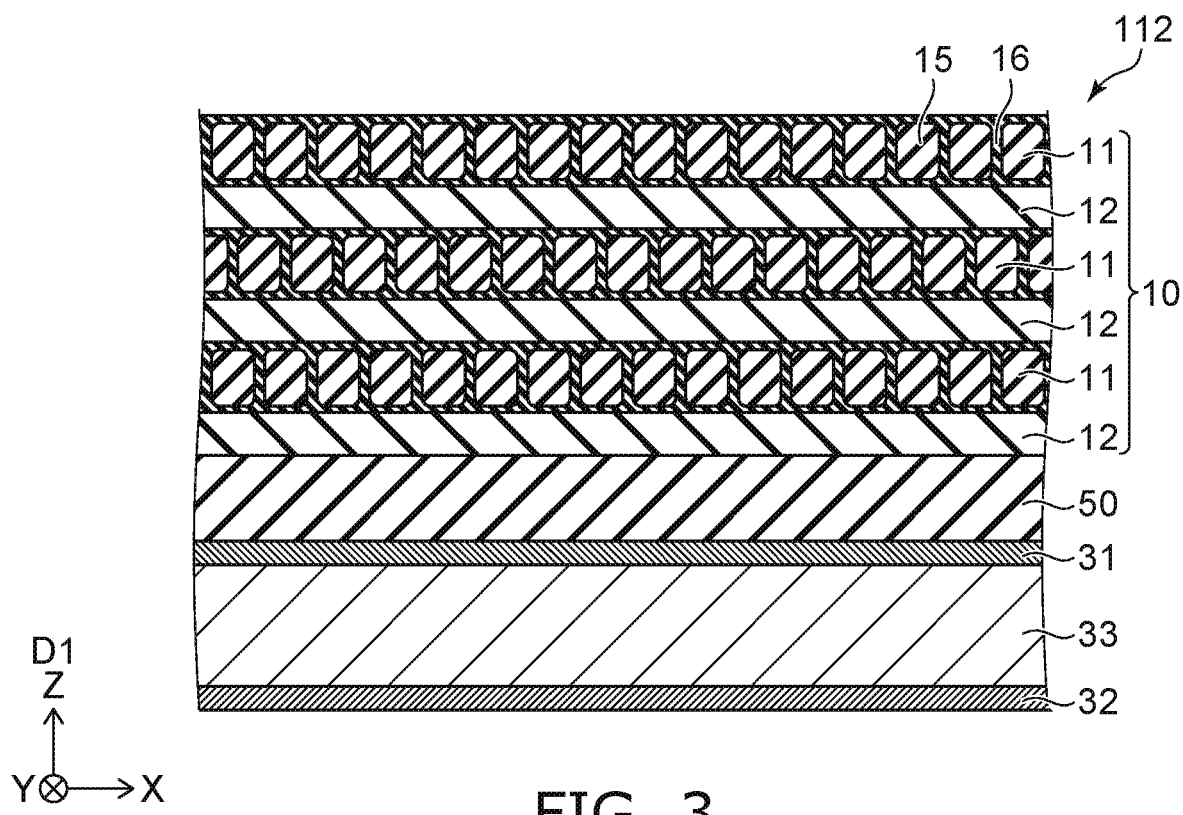
FIG. 3 is a schematic cross-sectional view illustrating a photoelectric conversion element according to the first embodiment.

FIG. 3 is a schematic cross-sectional view illustrating a photoelectric conversion element according to the first embodiment.

As shown in FIG. 3, in the photoelectric conversion element 112 according to the embodiment, the number of the plurality of first layers 11 provided on the first member 10 may be 3 or more.

Figure 4:
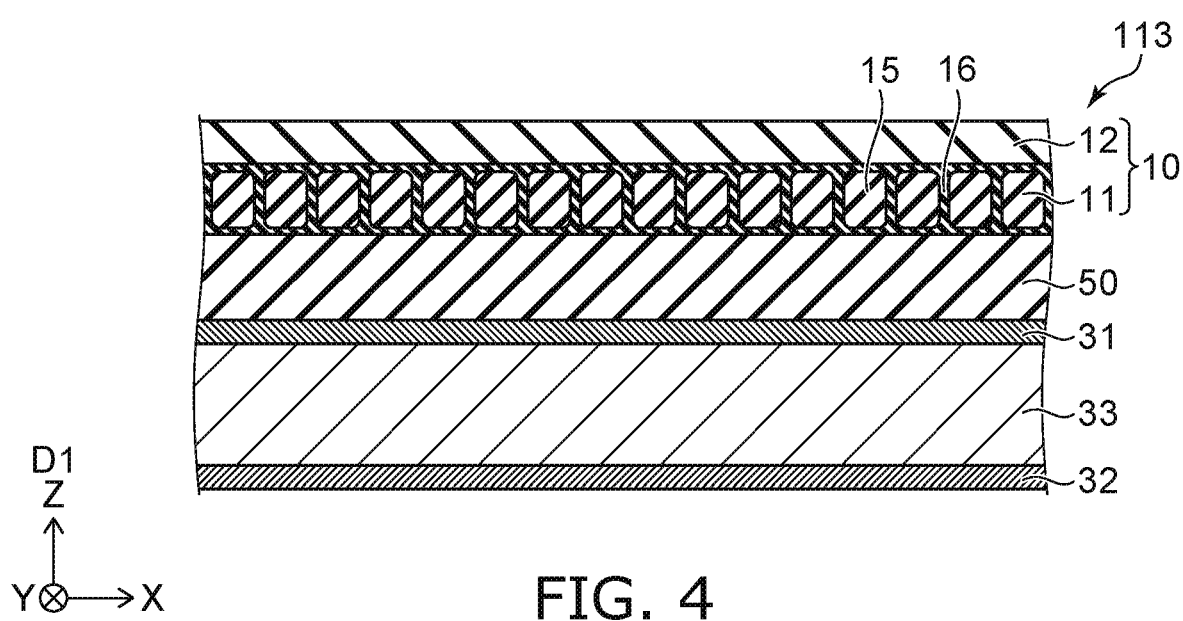
FIG. 4 is a schematic cross-sectional view illustrating a photoelectric conversion element according to the first embodiment.

FIG. 4 is a schematic cross-sectional view illustrating a photoelectric conversion element according to the first embodiment.

As shown in FIG. 4, in a photoelectric conversion element 113 according to the embodiment, the first layer 11 may be provided between the photoelectric conversion layer 33 and the second layer 12. By providing the second layer 12, the light 81 easily enters the first member 10.

For example, the second layer 12 may function as a protective layer or a smoothing layer. For example, in the first layer 11, surface unevenness tends to increase due to the plurality of particles 15. By the smooth surface being obtained by the second layer 12, it becomes easier for the light 81 to enter the first member 10.

As already explained, for example, the refractive index of the second layer 12 is lower than the refractive index of the first layer 11. Any material may be applied to the second layer 12 having such optical properties.

Second Embodiment

The second embodiment relates to a solar cell.

Figure 5:
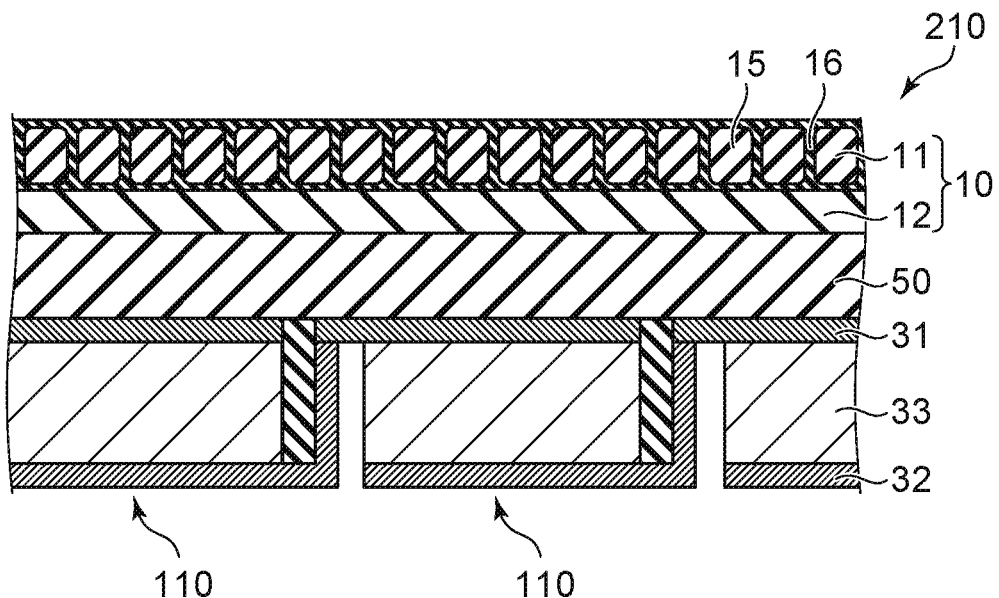
FIG. 5 is a schematic cross-sectional view illustrating a solar cell according to a second embodiment.

FIG. 5 is a schematic cross-sectional view illustrating a solar cell according to the second embodiment.

As shown in FIG. 5, a solar cell 210 according to the embodiment includes a plurality of photoelectric conversion elements (for example, photoelectric conversion elements 110) according to the first embodiment. At least two of the plurality of photoelectric conversion elements 110 may be electrically connected in series or in parallel. In this example, at least two of the plurality of photoelectric conversion elements 110 are electrically connected in series.

Figure 6:
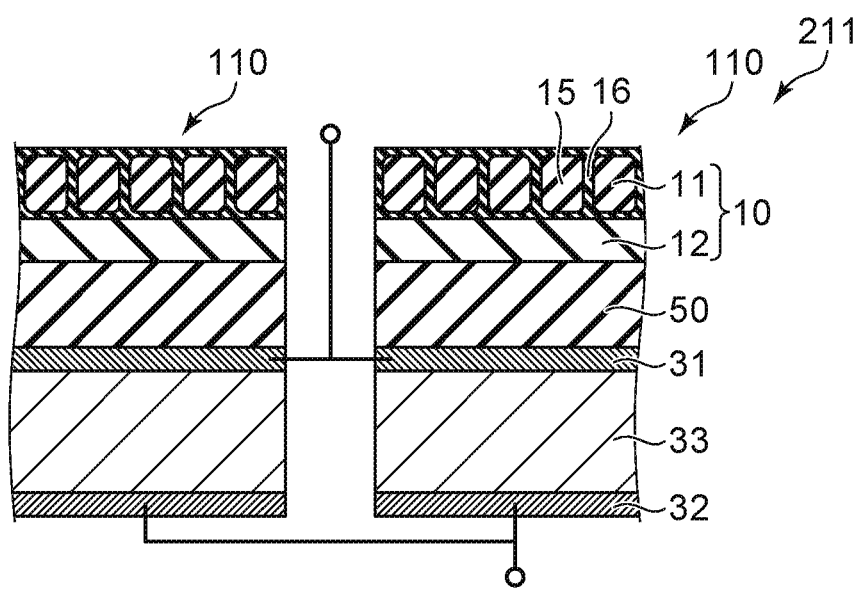
FIG. 6 is a schematic cross-sectional view illustrating a solar cell according to the second embodiment.

FIG. 6 is a schematic cross-sectional view illustrating a solar cell according to the second embodiment.

As shown in FIG. 6, in a solar cell 211 according to the embodiment, at least two of the plurality of photoelectric conversion elements 110 are electrically connected in parallel.

The embodiments may include the following configurations (for example, technical proposals).

Configuration 1

A photoelectric conversion element, comprising:
 a photoelectric conversion layer; and
 a first member,
 the first member including a first layer and a second layer,
 a direction from the second layer to the first layer being along a first direction from the photoelectric conversion layer to the first member,
 the first layer including a plurality of particles and an intermediate region provided in at least a part of location between the plurality of particles,
 the plurality of particles including at least one selected from the group consisting of oxygen and sulfur and zinc,
 the intermediate region including a rare earth element, and
 the second layer including a metal fluoride.

Configuration 2

The photoelectric conversion element according to Configuration 1, wherein
 the plurality of particles includes at least one selected from the group consisting of zinc oxide and zinc sulfide.

Configuration 3

The photoelectric conversion element according to Configuration 1 or 2, wherein
 the intermediate region includes an oxide of the rare earth element.

Configuration 4

The photoelectric conversion element according to any one of Configurations 1-3, wherein
 the intermediate region includes oxygen and at least one selected from the group consisting of europium, samarium and terbium.

Configuration 5

The photoelectric conversion element according to any one of Configurations 1-3, wherein
 the intermediate region includes an oxide of europium.

Configuration 6

The photoelectric conversion element according to any one of Configurations 1-5, wherein
 the intermediate region is in contact with at least a part of the plurality of particles.

Configuration 7

The photoelectric conversion element according to any one of Configurations 1-5, wherein
 the second layer is provided between the photoelectric conversion layer and the first layer.

Configuration 8

The photoelectric conversion element according to any one of Configurations 1-5, wherein
 the first layer is provided between the photoelectric conversion layer and the second layer.

Configuration 9

The photoelectric conversion element according to any one of Configurations 1-8, wherein
 an average diameter of the plurality of particles is not less than 10 nm and not more than 100 nm.

Configuration 10

The photoelectric conversion element according to any one of Configurations 1-9, wherein
 a first thickness along the first direction of the first layer is not less than 40 nm and not more than 100 nm.

Configuration 11

The photoelectric conversion element according to any one of Configurations 1-10, wherein a second thickness along the first direction of the second layer is not less than 500 nm and not more than 1000 nm.

Configuration 12

The photoelectric conversion element according to any one of Configurations 1-11, wherein the second layer includes at least one selected from the group consisting of magnesium fluoride, lithium fluoride and calcium fluoride.

Configuration 13

The photoelectric conversion element according to any one of Configurations 1-12, wherein a refractive index of the second layer is lower than a refractive index of the first layer.

Configuration 14

The photoelectric conversion element according to any one of Configurations 1-13, wherein the first member includes a plurality of the first layers, and the second layer is provided between one of the plurality of first layers and another one of the plurality of first layers.

Configuration 15

The photoelectric conversion element according to any one of Configurations 1-13, wherein the first member includes a plurality of the first layers and a plurality of the second layers, one of the plurality of first layers is provided between one of the plurality of second layers and another one of the plurality of second layers, and the one of the plurality of second layers is provided between the one of the plurality of first layers and another one of the plurality of first layers.

Configuration 16

The photoelectric conversion element according to any one of Configurations 1-15, wherein at least a part of the photoelectric conversion layer has a perovskite structure.

Configuration 17

The photoelectric conversion element according to any one of Configurations 1-16, further comprising:

a first electrode; and a second electrode, the first electrode being provided between the second electrode and the first member, the photoelectric conversion layer being provided between the second electrode and the first electrode, a light transmittance of the first electrode being higher than a light transmittance of the second electrode, and a light reflectance of the second electrode being higher than a light reflectance of the first electrode.

Configuration 18

The photoelectric conversion element according to Configuration 17, further comprising:

a base being light transmissive, the base being provided between the first electrode and the first member, and the base including a resin.

Configuration 19

A photoelectric conversion element, comprising:

a photoelectric conversion layer; and a first member, the first member including a first layer and a second layer, a direction from the second layer to the first layer being along a first direction from the photoelectric conversion layer to the first member, the first layer including a plurality of particles and an intermediate region provided in at least a part of location between the plurality of particles, the plurality of particles including at least one selected from the group consisting of oxygen and sulfur and zinc, the intermediate region including a rare earth element, a first thickness of the first layer along the first direction being not less than 40 nm and not more than 100 nm, and a refractive index of the second layer being lower than a refractive index of the first layer.

Configuration 20

A solar cell, comprising:

a plurality of the photoelectric conversion elements according to any one of Configurations 1-19, at least two of the plurality of photoelectric conversion elements being electrically connected in series or in parallel.

According to the embodiments, a photoelectric conversion element and a solar cell capable of obtaining stable characteristics are provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in photoelectric conversion elements such as photoelectric conversion element members, photoelectric conversion layers, electrodes, bases, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all photoelectric conversion elements and solar cells practicable by an appropriate design modification by one skilled in the art based on the photoelectric conversion elements and solar cells described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A photoelectric conversion element, comprising:

a photoelectric conversion layer;

a first member, the first member including a first layer and a second layer, a direction from the second layer to the first layer being along a first direction from the photoelectric conversion layer to the first member, the first layer including a plurality of particles and an intermediate region provided in at least a part of location between the plurality of particles, the plurality of particles including at least one selected from the group consisting of oxygen and sulfur and zinc,
the intermediate region including a rare earth element, and
the second layer including a metal fluoride;
a first electrode;
a second electrode,
the first electrode being provided between the second electrode and the first member,
the photoelectric conversion layer being provided between the second electrode and the first electrode,
a light transmittance of the first electrode being higher than a light transmittance of the second electrode, and
a light reflectance of the second electrode being higher than a light reflectance of the first electrode; and
a base being light transmissive,
the base being provided between the first electrode and the first member, and
the base including a resin.

2. The element according to claim 1, wherein
the plurality of particles includes at least one selected from the group consisting of zinc oxide and zinc sulfide.

3. The element according to claim 1, wherein
the intermediate region includes an oxide of the rare earth element.

4. The element according to claim 1, wherein
the intermediate region includes oxygen and at least one selected from the group consisting of europium, samarium and terbium.

5. The element according to claim 1, wherein
the intermediate region includes an oxide of europium.

6. The element according to claim 1, wherein
the intermediate region is in contact with at least a part of the plurality of particles.

7. The element according to claim 1, wherein
the intermediate region includes at least one salt selected from the group consisting of carbonate, nitrate, and sulfate.

8. The element according to claim 1, wherein
the second layer is provided between the photoelectric conversion layer and the first layer.

9. The element according to claim 1, wherein
the first layer is provided between the photoelectric conversion layer and the second layer.

10. The element according to claim 1, wherein
an average diameter of the plurality of particles is not less than 10 nm and not more than 100 nm.

11. The element according to claim 1, wherein
a first thickness along the first direction of the first layer is not less than 40 nm and not more than 100 nm.

12. The element according to claim 1, wherein
a second thickness along the first direction of the second layer is not less than 500 nm and not more than 1000 nm.

13. The element according to claim 1, wherein
a refractive index of the second layer is lower than a refractive index of the first layer.

14. The element according to claim 1, wherein
the first member includes a plurality of the first layers, and
the second layer is provided between one of the plurality of first layers and another one of the plurality of first layers.

15. The element according to claim 1, wherein
the first member includes a plurality of the first layers and a plurality of the second layers,
one of the plurality of first layers is provided between one of the plurality of second layers and another one of the plurality of second layers, and
the one of the plurality of second layers is provided between the one of the plurality of first layers and another one of the plurality of first layers.

16. The element according to claim 1, wherein
at least a part of the photoelectric conversion layer has a perovskite structure.

17. A photoelectric conversion element, comprising:
a photoelectric conversion layer;
a first member, the first member including a first layer and a second layer,
a direction from the second layer to the first layer being along a first direction from the photoelectric conversion layer to the first member,
the first layer including a plurality of particles and an intermediate region provided in at least a part of location between the plurality of particles,
the plurality of particles including at least one selected from the group consisting of oxygen and sulfur and zinc,
the intermediate region including a rare earth element,
a first thickness of the first layer along the first direction being not less than 40 nm and not more than 100 nm, and
a refractive index of the second layer being lower than a refractive index of the first layer;
a first electrode;
a second electrode,
the first electrode being provided between the second electrode and the first member,
the photoelectric conversion layer being provided between the second electrode and the first electrode,
a light transmittance of the first electrode being higher than a light transmittance of the second electrode, and
a light reflectance of the second electrode being higher than a light reflectance of the first electrode; and
a base being light transmissive,
the base being provided between the first electrode and the first member, and
the base including a resin.

18. A solar cell, comprising:
a plurality of the photoelectric conversion elements according to claim 1,
at least two of the plurality of photoelectric conversion elements being electrically connected in series or in parallel.

* * * * *